United States Patent
Tzeng et al.

(12)

(10) Patent No.: US 12,158,178 B2
(45) Date of Patent: Dec. 3, 2024

(54) SYSTEMS AND METHODS FOR UNIVERSAL CLAMPING OF INFORMATION HANDLING RESOURCE

(71) Applicant: Dell Products L.P., Round Rock, TX (US)

(72) Inventors: Chun-Kai Tzeng, KeeLung (TW); Chin-Chung Wu, New Taipei (TW); Chien-Cheng Chiu, New Taipei (TW); Te-Sen Chin, Taipei (TW)

(73) Assignee: Dell Products L.P., Round Rock, TX (US)

( * ) Notice: Subject to any disclaimer, the term of this patent is extended or adjusted under 35 U.S.C. 154(b) by 538 days.

(21) Appl. No.: 17/026,663

(22) Filed: Sep. 21, 2020

(65) Prior Publication Data

US 2022/0095471 A1  Mar. 24, 2022

(51) Int. Cl.
*F16B 5/06* (2006.01)
*F16B 2/06* (2006.01)
*H05K 7/14* (2006.01)

(52) U.S. Cl.
CPC ............ *F16B 5/0621* (2013.01); *F16B 2/065* (2013.01); *H05K 7/1405* (2013.01)

(58) Field of Classification Search
CPC .... F16B 2/02; F16B 2/06; F16B 2/065; F16B 5/02; F16B 5/0291; F16B 5/0607; F16B 5/0614; F16B 5/0621; F16B 5/0635; F16B 5/065; F16B 5/0657; F16B 5/0685; F16B 5/121; F16B 5/123; F16B 29/00; F16B 2200/506; F16B 2200/509; H05K 7/1401; H05K 7/1402; H05K 7/1404; H05K 7/1405; H05K 7/1407; Y10T 403/4691; Y10T 403/645; Y10T 403/648; Y10T 403/7062; Y10T 403/7067; Y10T 403/7111

(Continued)

(56) References Cited

U.S. PATENT DOCUMENTS 1,830,702 A * 11/1931 Johnson ................... F16B 9/052
                                                       403/190
2,716,434 A *  8/1955 Crowther .............. F16B 37/044
                                                       411/174

(Continued)

FOREIGN PATENT DOCUMENTS

AT          229642 B  * 10/1963  .............. F16B 12/32
DE       3246550 A1  *  6/1984  ................ F16B 9/02

(Continued)

*Primary Examiner* — Josh Skroupa
(74) *Attorney, Agent, or Firm* — Jackson Walker L.L.P.

(57) ABSTRACT

A clamp may include two substantially planar plates opposite from and generally parallel to one another, each plate having a mounting hole formed therein for receiving a fastener, two teeth, each tooth extending from a respective one of the two plates, such that each tooth is generally perpendicular to the plates, and such that each tooth extends towards the other from its respective plate, and a tongue opposite from and mechanically interfaced between the two plates, such that the tongue has a concave curved profile between the plates, and such that when a force is applied in a first direction by a fastener engaging with the clamp through the mounting holes, compression of the plates towards one another causes deflection of the tongue in a second direction substantially perpendicular to the first direction.

14 Claims, 6 Drawing Sheets

(58) Field of Classification Search
USPC .......... 403/262, 337, 338, 373, 374.3, 386; 411/172–175
See application file for complete search history.

(56) References Cited

U.S. PATENT DOCUMENTS

| | | | | |
|---|---|---|---|---|
| 2,967,556 | A * | 1/1961 | Jaworski | F16B 37/044 411/112 |
| 2,974,703 | A * | 3/1961 | Rapata | F16B 5/0291 403/231 |
| 3,757,283 | A * | 9/1973 | Kelly | H01R 11/281 24/135 R |
| 3,797,548 | A * | 3/1974 | Barnett | F16B 39/38 411/174 |
| 4,118,136 | A * | 10/1978 | Corsmeier | F01D 5/08 403/197 |
| 4,158,377 | A * | 6/1979 | Beyl | F16B 29/00 280/611 |
| 4,472,016 | A * | 9/1984 | Rodseth | H01R 13/113 439/856 |
| 4,606,455 | A * | 8/1986 | Grikis | F16B 15/08 206/347 |
| 4,907,301 | A * | 3/1990 | Tucker | E03D 11/16 4/DIG. 9 |
| 5,489,172 | A * | 2/1996 | Michler | B64D 11/0696 410/104 |
| 5,588,726 | A * | 12/1996 | Lee | F16B 12/02 403/231 |
| 5,730,547 | A * | 3/1998 | Nogami | B60G 13/006 403/384 |
| 5,791,607 | A * | 8/1998 | Thibault | F16L 3/221 403/381 |
| 5,893,617 | A * | 4/1999 | Lee | F16B 12/125 403/231 |
| 5,897,276 | A * | 4/1999 | Hartel | F16B 37/041 411/174 |
| 6,652,120 | B2 * | 11/2003 | Gordon | F21V 21/00 362/396 |
| 7,191,990 | B2 * | 3/2007 | Hutter, III | F16B 2/065 248/316.4 |
| 7,241,068 | B2 * | 7/2007 | Aota | F16D 3/387 403/155 |
| 7,488,134 | B2 * | 2/2009 | Kinme | F16D 3/387 403/155 |
| 8,074,954 | B2 * | 12/2011 | Wilhelm | B64D 11/0696 244/118.6 |
| 8,182,183 | B2 * | 5/2012 | Cook | B60N 2/01558 410/104 |
| 8,522,408 | B2 * | 9/2013 | Lill | E03F 1/00 411/174 |
| 8,858,138 | B2 * | 10/2014 | Hearn | B60N 2/01516 410/104 |
| 9,640,856 | B2 * | 5/2017 | Malek | F16B 9/058 |
| 9,902,498 | B2 * | 2/2018 | Gensch | B64D 11/0696 |
| 9,938,998 | B2 * | 4/2018 | Krohn | F16B 5/02 |
| 10,259,585 | B2 * | 4/2019 | Sodore | B64D 11/0696 |
| 10,507,924 | B2 * | 12/2019 | Marais | B64D 11/0696 |
| 10,676,196 | B2 * | 6/2020 | Pacheco | B64D 11/0619 |
| 11,008,108 | B2 * | 5/2021 | Gilbert | B64D 11/0696 |
| 11,214,374 | B2 * | 1/2022 | Lucas | B64D 11/0696 |
| 2006/0062651 | A1 * | 3/2006 | Kuo | F16B 2/065 411/172 |

FOREIGN PATENT DOCUMENTS

| | | | | |
|---|---|---|---|---|
| DE | 102010037741 | A1 * | 3/2012 | ............ F16B 37/045 |
| DE | 202018106120 | U1 * | 4/2019 | .............. F16B 2/245 |
| DE | 202019004796 | U1 * | 2/2020 | ............ B60P 7/0815 |
| EP | 2048286 | A1 * | 4/2009 | .......... E01F 15/0423 |
| EP | 3348722 | A1 * | 7/2018 | ............ F16B 5/0635 |
| FR | 2870578 | A1 * | 11/2005 | ................ F16F 9/54 |

* cited by examiner

SYSTEMS AND METHODS FOR UNIVERSAL CLAMPING OF INFORMATION HANDLING RESOURCE

TECHNICAL FIELD

The present disclosure relates in general to information handling systems, and more particularly to a systems and methods for implementing a universal clamp for securing information handling resources within an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often comprise many information handling resources (e.g., processors, hard drives, peripheral devices, memories, batteries, air movers, etc.). Oftentimes, it is necessary to mechanically affix information handling resources in a particular location within an enclosure of an information handling system. For example, batteries, hard drives, air movers, and other information handling resources may be fixed within an information handling system enclosure via a screw or other fastener that passes through a hole of a tab extending from the information handling resource, allowing the information handling resource to be mechanically mounted by fastening the fastener through the hole in the tab and into another hole configured to receive the fastener and formed in a printed circuit board or formed within the enclosure itself.

However, such existing approach has many disadvantages. For example, such tabs are often susceptible to breakage, which may irreversibly damage the mechanical mounting features of an information handling resource such that it cannot be properly affixed within an information handling system. Furthermore, such tabs may mechanically interfere with other components, such as printed circuit boards that may reside in the information handling system enclosure. In addition, placement of tabs on an information handling resource may limit locations in which it may be placed within an information handling system enclosure.

SUMMARY

In accordance with the teachings of the present disclosure, the disadvantages and problems associated with mechanically securing information handling resources may be reduced or eliminated.

In accordance with embodiments of the present disclosure, a clamp may include two substantially planar plates opposite from and generally parallel to one another, each plate having a mounting hole formed therein for receiving a fastener, two teeth, each tooth extending from a respective one of the two plates, such that each tooth is generally perpendicular to the plates, and such that each tooth extends towards the other from its respective plate, and a tongue opposite from and mechanically interfaced between the two plates, such that the tongue has a concave curved profile between the plates, and such that when a force is applied in a first direction by a fastener engaging with the clamp through the mounting holes, compression of the plates towards one another causes deflection of the tongue in a second direction substantially perpendicular to the first direction.

In accordance with these and other embodiments of the present disclosure, a mechanical member may include a body and a mounting rail extending from the body such that two grooves are formed between the body and the mounting rail, each groove configured to engage with a respective tooth of a clamp configured to mechanically couple to the mounting rail via a fastener, wherein the mounting rail comprises at least one semi-cylindrical positioning notch sized and shaped to receive the fastener.

In accordance with these and other embodiments of the present disclosure, a method for coupling a mechanical member to a structural base may include mechanically coupling a clamp to a mounting rail of the mechanical member with a fastener, wherein the clamp comprises two substantially planar plates opposite from and generally parallel to one another, each plate having a mounting hole formed therein for receiving the fastener, two teeth, each tooth extending from a respective one of the two plates, such that each tooth is generally perpendicular to the plates, and such that each tooth extends towards the other from its respective plate, and a tongue opposite from and mechanically interfaced between the two plates, such that the tongue has a concave curved profile between the plates, and such that when a force is applied in a first direction by a fastener engaging with the clamp through the mounting holes, compression of the plates towards one another causes deflection of the tongue in a second direction substantially perpendicular to the first direction. The mechanical member may include a body and the mounting rail extending from the body such that two grooves are formed between the body and the mounting rail, each groove configured to engage with a respective tooth of the clamp, wherein the mounting rail comprises at least one semi-cylindrical positioning notch sized and shaped to receive the fastener. The method may also include fastening the fastener to an insert formed in the structural base.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

Figure 1A:
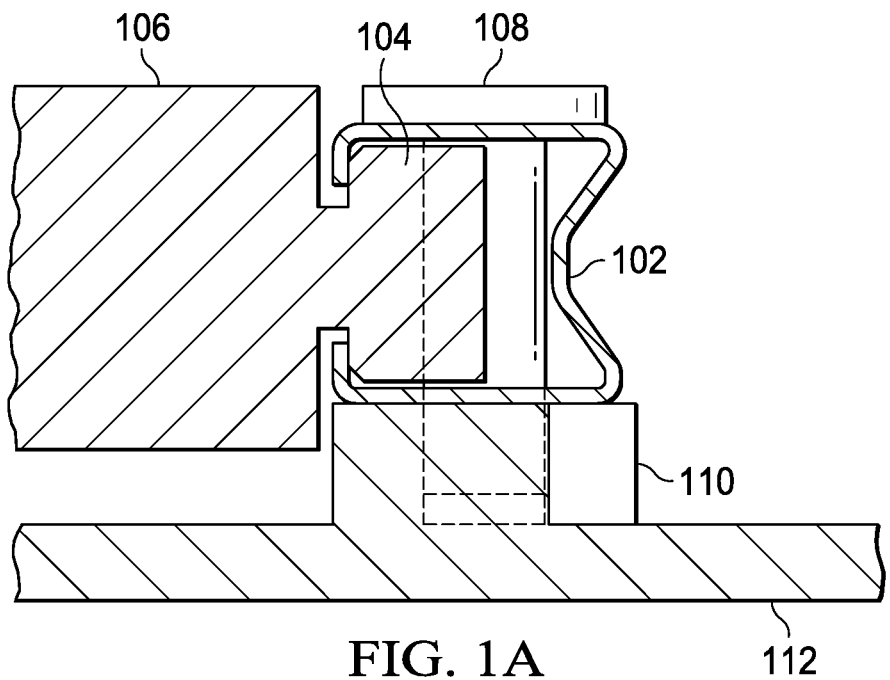
FIG. 1A illustrates a cross-sectional side elevation view of a clamp mechanically engaged in an uncompressed state with a mounting rail of an information handling resource and affixed via a fastener to an insert mounted to a base structure, in accordance with embodiments of the present disclosure.
Figure 1B:
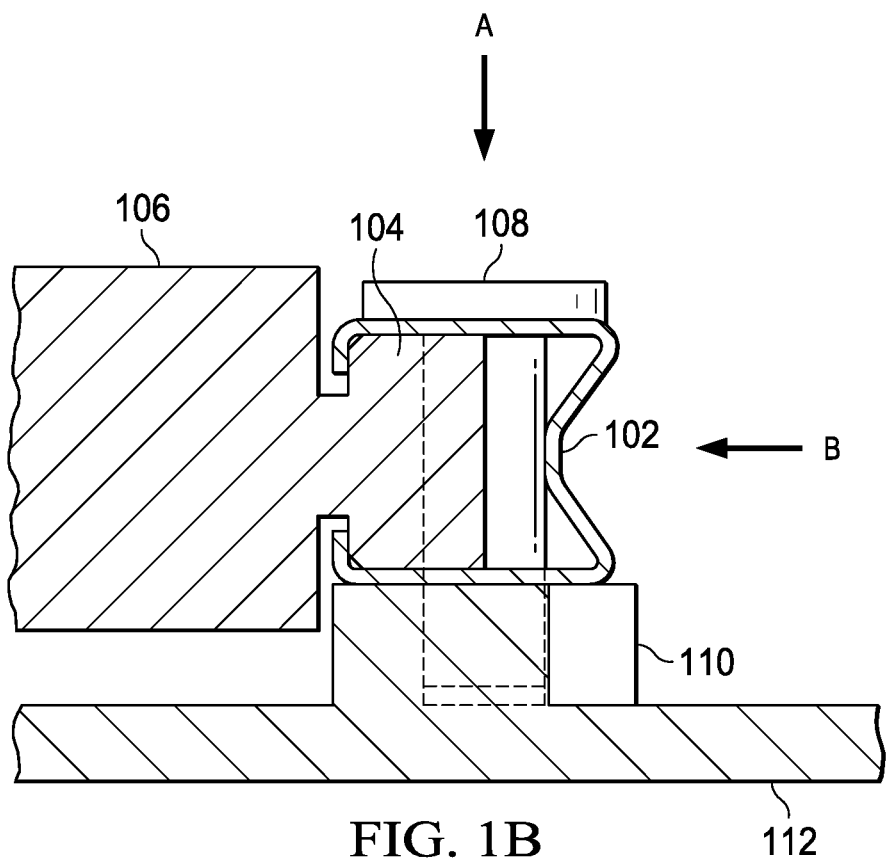
FIG. 1B illustrates a cross-sectional side elevation view of a clamp mechanically engaged in a compressed state with a mounting rail of an information handling resource and affixed via a fastener to an insert mounted to a base structure, in accordance with embodiments of the present disclosure.

FIG. 1A illustrates a cross-sectional side elevation view of a clamp 102 mechanically engaged with a mounting rail 104 of an information handling resource 106 and affixed via a fastener 108 (e.g., a threaded screw) to an insert 110 (e.g., threaded to receive fastener 108) mounted to a base structure 112 (e.g., a wall, ceiling, or floor of an information handling system enclosure), in accordance with embodiments of the present disclosure. As used herein, "information handling resource" may broadly refer to any component system, device or apparatus of an information handling system, including without limitation a processor, a service processor, a basic input/output system (BIOS), a memory, an I/O device and/or interface, a storage resources (e.g., a hard disk drive), a network interface, a motherboard, a battery, and air mover (e.g., a fan or a blower), and/or any other components and/or elements of an information handling system.

FIG. 1A illustrates clamp 102 in an uncompressed state. When clamp 102, mounting rail 104, fastener 108, and insert 110 are arranged as shown in FIG. 1A and fastener 108 is driven into insert 110 in a direction A shown in FIG. 1B, clamp 102 may enter a compressed state, in which clamp 102 is mechanically compressed by the force of driving fastener 108 in direction A. In addition, as described in greater detail below, due to the shape of clamp 102, such force in direction A may also cause a deflection of a portion of clamp 102 in direction B, thus allowing clamp 102 to provide two directions of clamping force onto mounting rail 104 and fastener 108 resulting from external application of force in single direction A.

Figure 2:
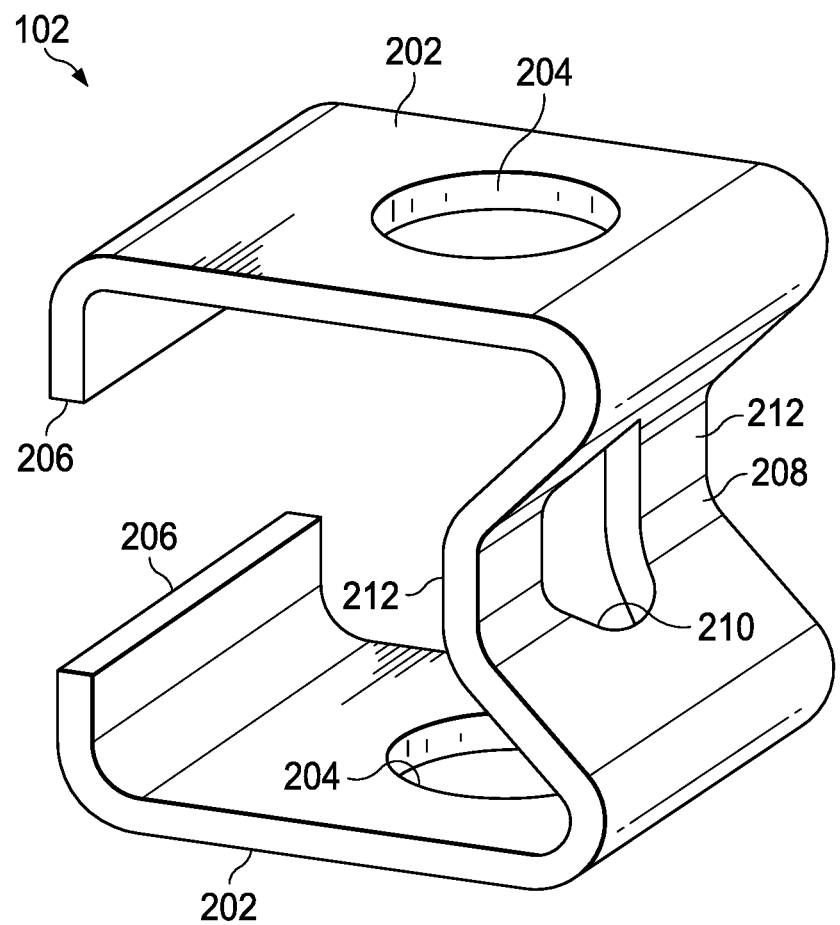
FIG. 2 illustrates an isometric perspective view of a clamp, in accordance with embodiments of the present disclosure.

FIG. 2 illustrates an isometric perspective view of a clamp 102, in accordance with embodiments of the present disclosure. As seen from FIGS. 1A and 1B, as also shown in FIG. 2, as viewed from the perspective of FIGS. 1A and 1B, clamp 102 may generally be in the shape of Greek letter Σ (capital-letter sigma). As shown in FIG. 2, clamp 102 may comprise two substantially planar plates 202 opposite from and generally parallel to one another, each with mounting holes 204 formed therein for receiving fastener 108. A tooth 206 may extend from each plate 202, such that each tooth 206 is generally perpendicular to plates 202 (although tooth 206 may extend in a curved manner from a plate 202), and such that each tooth 206 extends towards the other from its respective plate 202. As described elsewhere herein, each tooth 206 may be configured to engage with a groove formed between a body of information handling resource 106 and mounting rail 104.

A tongue 208 opposite from teeth 206 may mechanically interface between opposite plates 202. As shown in FIG. 2, tongue 208 may have a concave curved profile between plates 202, such that it is possible to draw a line perpendicular to the surfaces of plates 202 proximate to tongue 208 that passes through tongue 208. As further shown in FIG. 2, tongue 208 may have formed therein a guide hole 210 and flanges 212 on either side of guide hole 210. Guide hole 210 may, in some embodiments, guide a path of fastener 108 through clamp 102, as well as allowing flanges 212 to at least partially wrap around fastener 108 to mechanically engage flanges 212 when clamp 102 is forced between its uncompressed state (e.g., FIG. 1A) and its compressed state (e.g., FIG. 1B).

In some embodiments, clamp 102 may be formed from a pliable metal. In these and other embodiments, clamp 102 may be formed from a single piece of material.

Figure 3A:
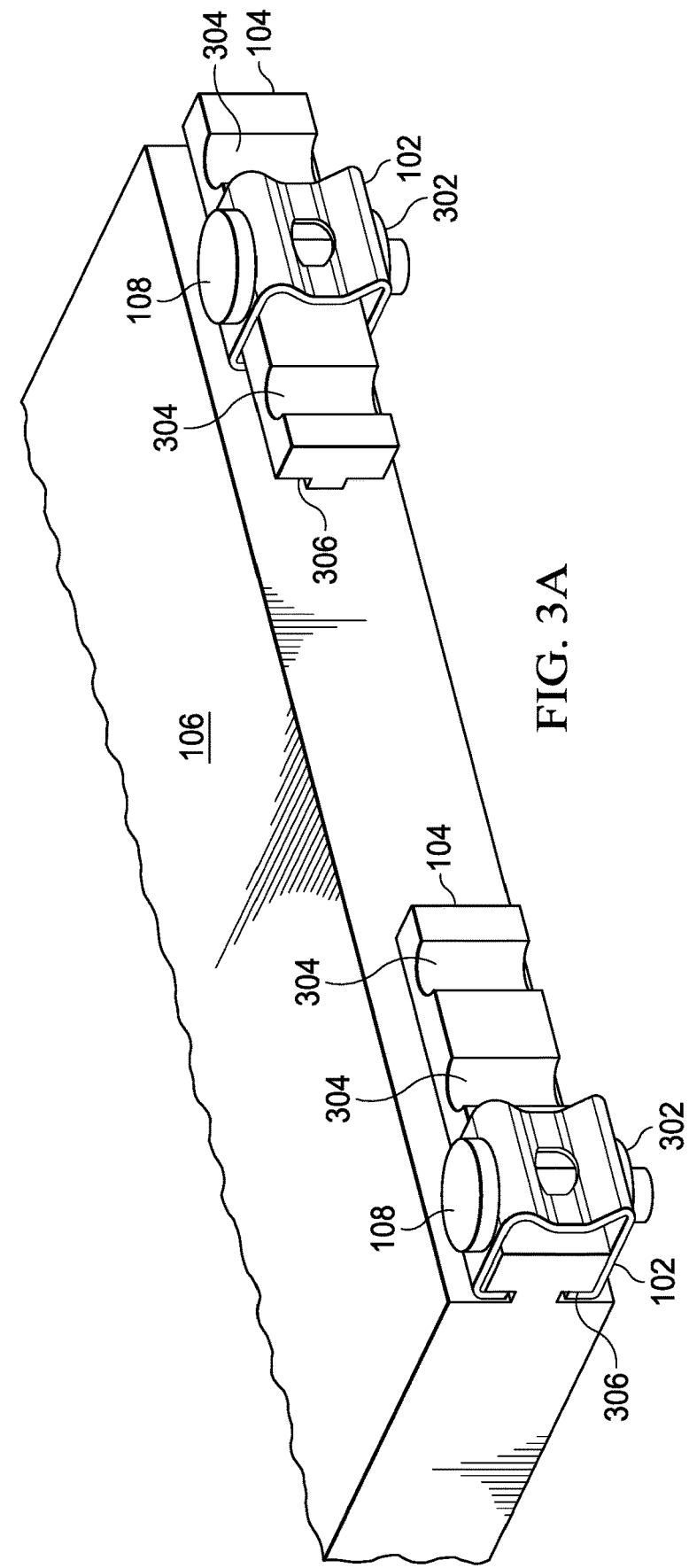
FIG. 3A illustrates an isometric perspective view of a top of an information handling resource with a clamp mechanically engaged with a mounting rail of the information handling resource via a fastener, in accordance with embodiments of the present disclosure.
Figure 3B:
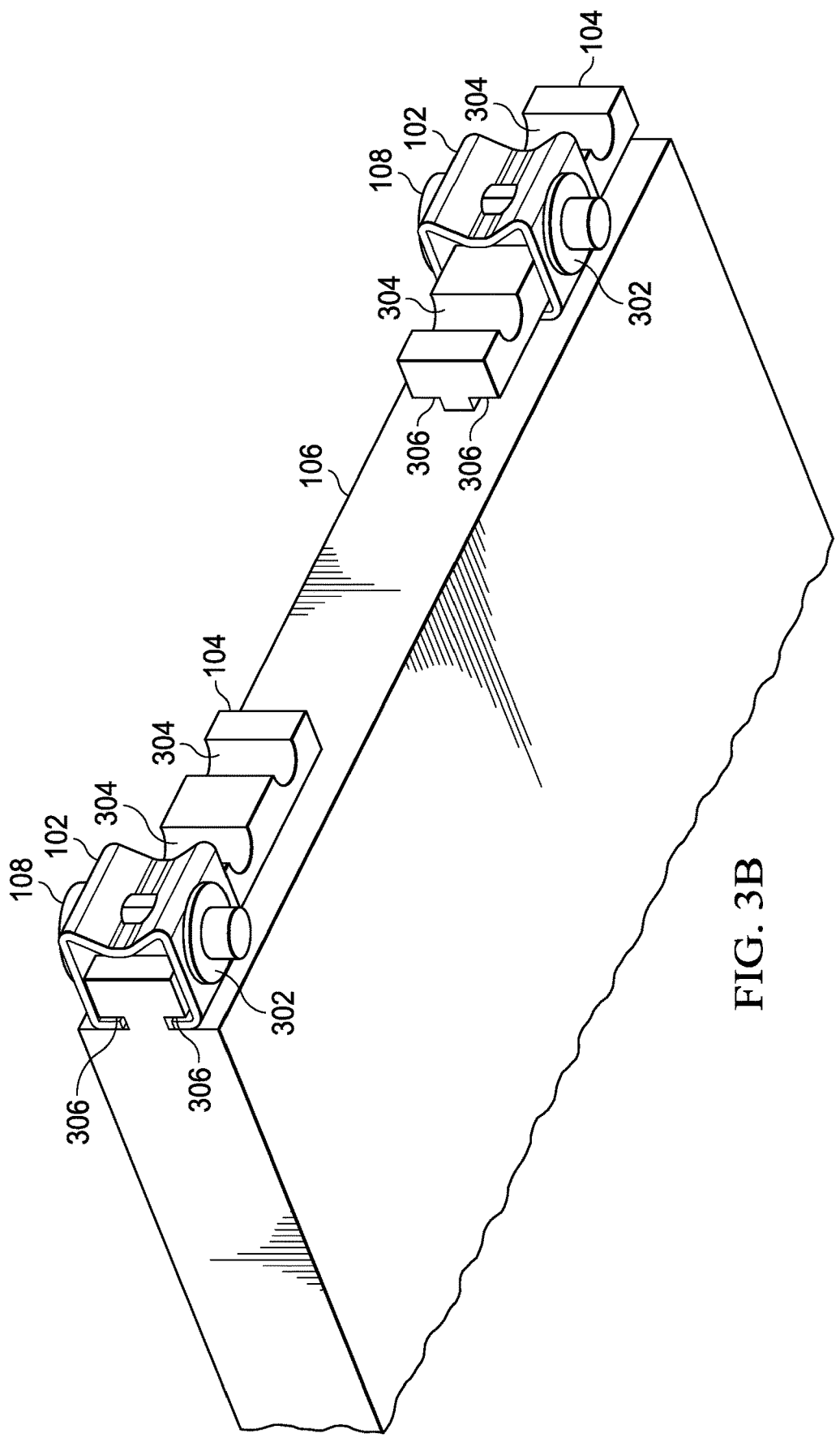
FIG. 3B illustrates an isometric perspective view of a bottom of an information handling resource with a clamp mechanically engaged with a mounting rail of the information handling resource via a fastener, in accordance with embodiments of the present disclosure.
Figure 4:
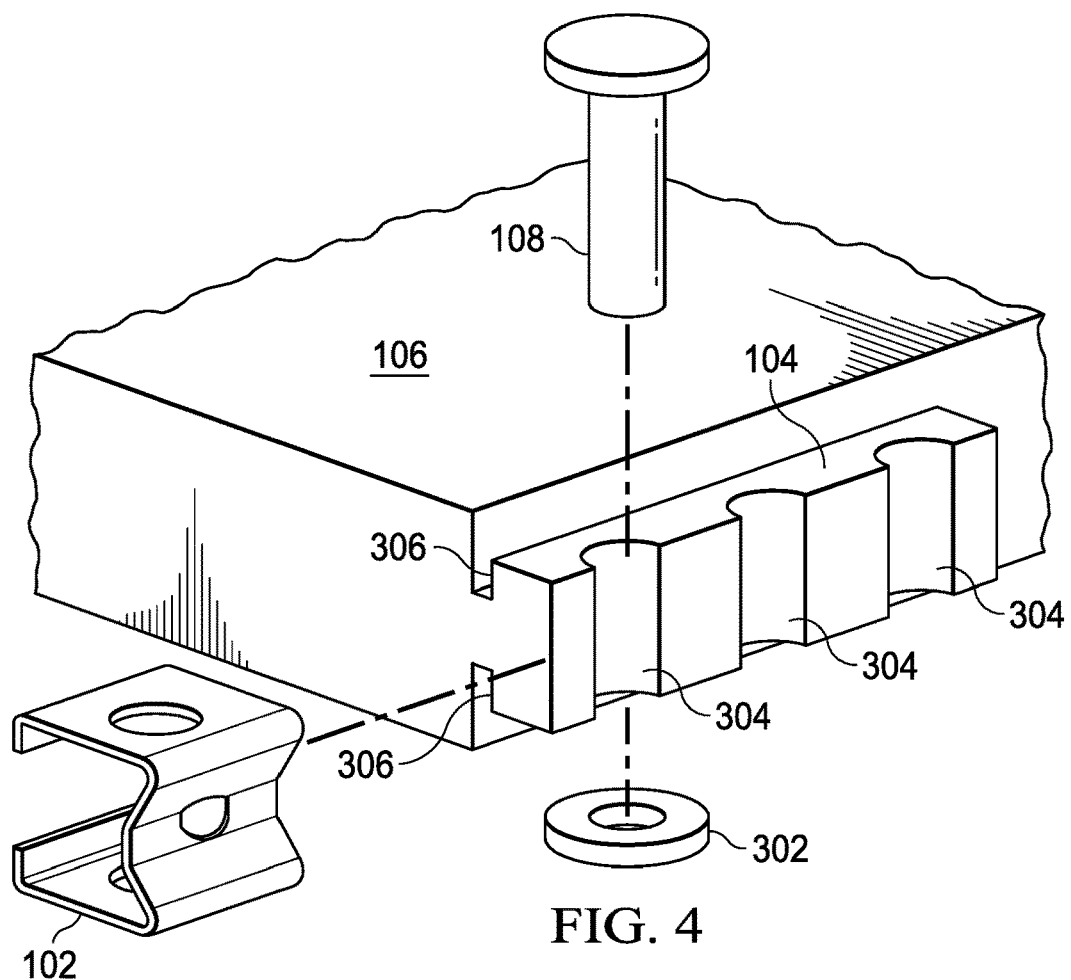
FIG. 4 illustrates an exploded perspective view a of mounting rail 104 of an information handling resource, a fastener, and a clamp, in accordance with embodiments of the present disclosure.

FIG. 3A illustrates a isometric perspective view of a top of information handling resource 106 with clamp 102 mechanically engaged with mounting rail 104 of information handling resource 106 and via fastener 108, in accordance with embodiments of the present disclosure. FIG. 3B illustrates a isometric perspective view of a bottom of information handling resource 106 with clamp 102 mechanically engaged with mounting rail 104 of information handling resource 106 and via fastener 108, in accordance with embodiments of the present disclosure. FIG. 4 illustrates an exploded view of mounting rail 104 of information handling resource 106, fastener 108, and clamp 102, in accordance with embodiments of the present disclosure.

As shown in FIGS. 3A, 3B, and 4, in some embodiments, a washer 302 may be used to further secure fastener 108 to clamp 102 prior to driving fastener 108 into insert 110.

Further as shown in FIGS. 3A, 3B, and 4, mounting rail 104 may extend from information handling resource 106 such that grooves 306 are formed between information handling resource 106 and mounting rail 104. Each groove 306 may be appropriately sized and shaped to receive a tooth 206 of clamp 102, in order to partially hold clamp 102 in place relative to information handling resource 106.

As also shown in FIGS. 3A, 3B, and 4, mounting rail 104 may include one or more semi-cylindrical positioning notches 304. Each positioning notch 304 may be appropriately sized and shaped to receive fastener 108 therethrough. When mounting rail 104 comprises a plurality of positioning notches 304, one of such positioning notches 304 may be selected for coupling clamp 102 to mounting rail 104, providing flexibility in locating fastener 108 and clamp 102 relative to information handling resource 106 and thus providing flexibility in a location of information handling resource 106 within an enclosure of an information handling resource.

Figure 5A:
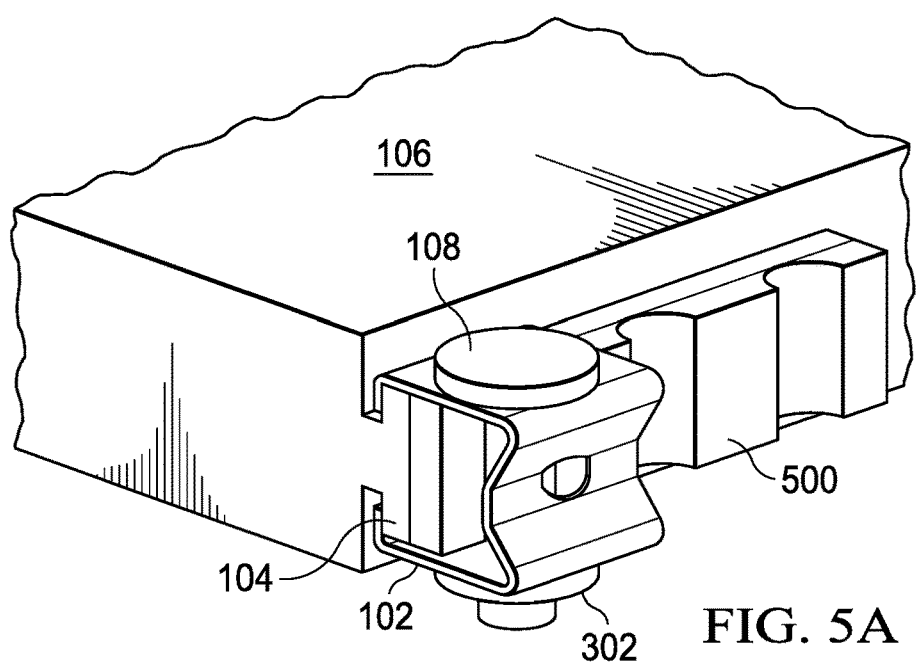
FIG. 5A illustrates an isometric perspective view of a top of an information handling resource with a clamp mechanically engaged with a mounting rail of the information handling resource via a fastener, the mounting rail having a damping material formed thereon, in accordance with embodiments of the present disclosure.
Figure 5B:
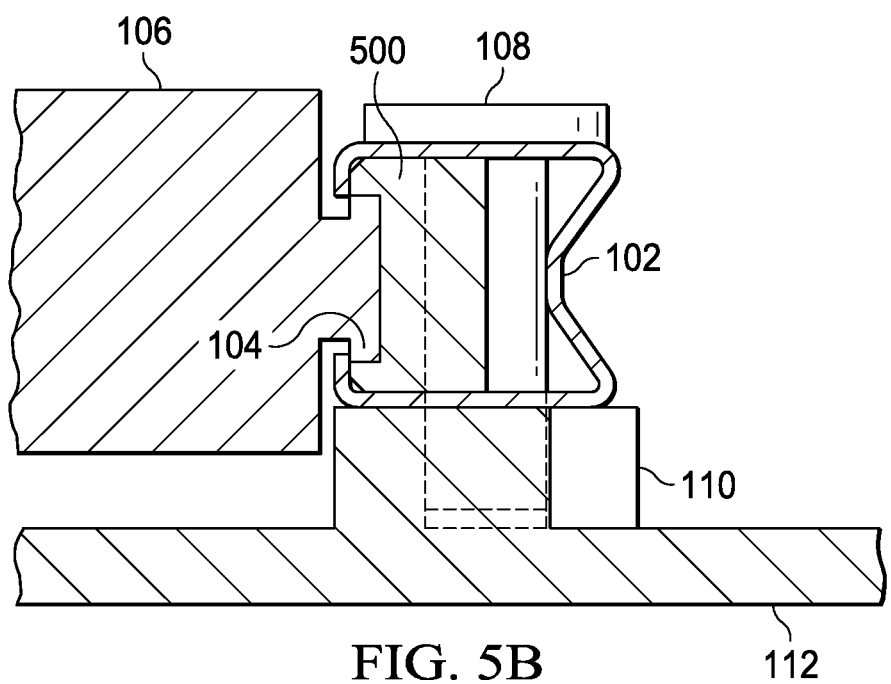
FIG. 5B illustrates a cross-sectional side elevation view of a clamp mechanically engaged in a compressed state with a mounting rail of an information handling resource and affixed via a fastener to an insert mounted to a base structure, the mounting rail having a damping material formed thereon, in accordance with embodiments of the present disclosure.

FIG. 5A illustrates an isometric perspective view of a top of information handling resource 106 with clamp 102 mechanically engaged with mounting rail 104 of information handling resource 106 via fastener 108, wherein mounting rail 104 has a damping material 500 formed thereon, in accordance with embodiments of the present disclosure. FIG. 5B illustrates a cross-sectional side elevation view of clamp 102 mechanically engaged in a compressed state with mounting rail 104 of information handling resource 106 and affixed via fastener 108 to insert 110 mounted to base structure 112, wherein mounting rail 104 has a damping material 500 formed thereon, in accordance with embodiments of the present disclosure. In some embodiments, mounting rail 104 may include damping material 500 formed thereon to provide shock, vibration, or acoustic resistance when information handling resource 106 comprises a component sensitive to external vibration (e.g., a hard disk drive) or a component that may generate vibration (e.g., an air mover).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A clamp comprising:
   two substantially planar plates opposite from and generally parallel to one another, each plate having a mounting hole formed therein for receiving a fastener;
   two teeth, each tooth extending from a respective one of the two plates, such that each tooth is generally perpendicular to the plates, and such that each tooth extends towards the other from its respective plate; and
   a tongue opposite from and mechanically interfaced between the two plates, such that the tongue has a concave curved profile between the plates, and such that when a force is applied in a first direction by a fastener engaging with the clamp through the mounting holes, compression of the plates towards one another causes deflection of the tongue in a second direction substantially perpendicular to the first direction.

2. The clamp of claim 1, wherein the tongue has formed therein a guide hole and a flange on either side of the guide hole.

3. The clamp of claim 2, wherein the guide hole is configured to guide a path of the fastener through the clamp.

4. The clamp of claim 2, wherein the flanges are configured to mechanically engage with the fastener during deflection of the tongue in the second direction.

5. The clamp of claim 1, wherein the clamp is formed of metal.

6. The clamp of claim 1, wherein the clamp is formed from a single piece of material.

7. A method for coupling a mechanical member to a structural base, comprising:
   mechanically coupling a clamp to a mounting rail of the mechanical member with a fastener, wherein:
      the clamp comprises:
         two substantially planar plates opposite from and generally parallel to one another, each plate having a mounting hole formed therein for receiving the fastener;
         two teeth, each tooth extending from a respective one of the two plates, such that each tooth is generally perpendicular to the plates, and such that each tooth extends towards the other from its respective plate; and
         a tongue opposite from and mechanically interfaced between the two plates, such that the tongue has a concave curved profile between the plates, and such that when a force is applied in a first direction by the fastener engaging with the clamp through the mounting holes, compression of the plates towards one another causes deflection of the tongue in a second direction substantially perpendicular to the first direction; and
      the mechanical member comprises:
         a body; and
         the mounting rail extending from the body such that two grooves are formed between the body and the mounting rail, each groove configured to engage with a respective tooth of the clamp, wherein the mounting rail comprises at least one semi-cylindrical positioning notch sized and shaped to receive the fastener; and
   fastening the fastener to an insert formed in the structural base.

8. The method of claim 7, wherein the mounting rail comprises a plurality of positioning notches and coupling the clamp to the mounting bracket comprises selecting one of such positioning notches for coupling the clamp to the mounting rail.

9. The method of claim 7, wherein:
   the mechanical member comprises an information handling resource of an information handling system; and
   the structural base comprises a portion of an enclosure of the information handling system.

10. The method of claim 7, wherein the tongue has formed therein a guide hole and a flange on either side of the guide hole.

11. The method of claim 10, further comprising guiding a path of the fastener through the clamp via the guide hole.

12. The method of claim 10, further comprising mechanically engaging the flanges with the fastener during deflection of the tongue in the second direction.

13. The method of claim 7, wherein the clamp is formed of metal.

14. The method of claim 7, wherein the clamp is formed from a single piece of material.

* * * * *